US010998280B2

(12) United States Patent
Ikeda et al.

(10) Patent No.: US 10,998,280 B2
(45) Date of Patent: May 4, 2021

(54) BALANCE-UNBALANCE CONVERTER AND SEMICONDUCTOR INTEGRATED CIRCUIT HAVING THE SAME

(71) Applicant: ANRITSU CORPORATION, Kanagawa (JP)

(72) Inventors: Michihiko Ikeda, Kanagawa (JP); Yuji Sekine, Kanagawa (JP); Takao Yamaguchi, Kanagawa (JP)

(73) Assignee: ANRITSU CORPORATION, Kanagawa (JP)

( * ) Notice: Subject to any disclaimer, the term of this patent is extended or adjusted under 35 U.S.C. 154(b) by 29 days.

(21) Appl. No.: 16/279,330

(22) Filed: Feb. 19, 2019

(65) Prior Publication Data
US 2019/0295969 A1 Sep. 26, 2019

(30) Foreign Application Priority Data
Mar. 23, 2018 (JP) .............................. JP2018-057088

(51) Int. Cl.
*H01L 23/66* (2006.01)
*H01P 5/10* (2006.01)
(Continued)

(52) U.S. Cl.
CPC .............. *H01L 23/66* (2013.01); *H01P 5/10* (2013.01); *H03D 7/1408* (2013.01);
(Continued)

(58) Field of Classification Search
CPC ......... H01L 23/66; H01P 5/10; H03D 7/1408; H03H 11/32
See application file for complete search history.

(56) References Cited

U.S. PATENT DOCUMENTS

| 5,574,409 | A | * | 11/1996 | Nishida | ............... H04L 27/2039 |
| | | | | | 332/105 |
| 5,949,297 | A | | 9/1999 | Nishida | |
| 2013/0162366 | A1 | * | 6/2013 | Essenwanger | ............ H01P 5/10 |
| | | | | | 333/26 |

FOREIGN PATENT DOCUMENTS

| JP | H08-125446 A | 5/1996 |
| JP | H10-13156 A | 1/1998 |

OTHER PUBLICATIONS

R.K. Mongia, et al., "RF and Microwave Coupled-Line Circuits Second Edition", 2007, Artech House, pp. 485, Fig. 13.5(c).
(Continued)

*Primary Examiner* — Matthew E. Gordon
(74) *Attorney, Agent, or Firm* — Pearne & Gordon LLP

(57) ABSTRACT

Provided is a balance-unbalance converter including: a substrate; an unbalanced line; a first balanced line; and a second balanced line on the substrate. The unbalanced line has a first end at which an unbalanced signal is input, and an opened second end. The first balanced line is in parallel with a line portion of the unbalanced line from the first end to a midpoint of the unbalanced line, and has a midpoint-side third end at which a balanced signal is output, and a grounded fourth end. The second balanced line is in parallel with a line portion of the unbalanced line from the second end to the midpoint, and has a midpoint-side fifth end at which the balanced signal is output, and a grounded sixth end. The unbalanced line is bent at the midpoint toward an opposite side of the first and second balanced lines.

15 Claims, 18 Drawing Sheets

(51) Int. Cl.
    *H03H 11/32*       (2006.01)
    *H03D 7/14*        (2006.01)
    *H01L 27/06*       (2006.01)
    *H01L 49/02*       (2006.01)

(52) U.S. Cl.
    CPC ......... *H03H 11/32* (2013.01); *H01L 27/0641* (2013.01); *H01L 28/10* (2013.01); *H01L 2223/6616* (2013.01); *H01L 2223/6627* (2013.01)

(56) References Cited

OTHER PUBLICATIONS

S.A. MAAS, et al., "A Broadband, Planar, Monolithic Resistive Frequency Doubler", Microwave and Millimeter-Wave Monolithic Circuits Symposium, 1994, Digest of Papers, IEEE ,1994, p. 177, Figure 3.

* cited by examiner

BALANCE-UNBALANCE CONVERTER AND SEMICONDUCTOR INTEGRATED CIRCUIT HAVING THE SAME

CROSS-REFERENCE TO RELATED APPLICATIONS

This application claims priority to Japanese Patent Application No. 2018-057088, filed Mar. 23, 2018, the entire contents of which are incorporated herein by reference.

BACKGROUND OF THE INVENTION

Field of the Invention

The present invention relates to balance-unbalance converters and semiconductor integrated circuits having the same.

Description of Related Art

Conventionally, a balance-unbalance converter (balun) has been used to mutually convert a balanced signal and an unbalanced signal. A planar-structure merchant balun is already known as a kind of balance-unbalance converter (see, for example, Non-Patent Documents 1 and 2). The merchant balun is a balun that is configured to carry out the conversion between a balanced signal and an unbalanced signal using a pair of quarter-wavelength coupled lines.

Non-Patent Document 1 discloses a merchant balun in which two balanced lines each having a length of λ/4 are disposed in parallel with a straight-line-structure unbalanced line, where λ is a wavelength of a signal having a center frequency of an operating band. One end of the unbalanced line is connected to an unbalanced input terminal, and each of the two balanced lines is connected to a balanced output terminal at an end corresponding to a longitudinal midpoint of the unbalanced line.

Non-Patent Document 2 discloses a frequency doubler that includes an input-side balun, an output-side balun, and four diodes on a substrate. Each of the input-side balun and the output-side balun constitutes a straight-line-structure merchant balun. The frequency doubler performs full-wave rectification of an input high-frequency signal to output a high-frequency signal having twice the frequency of the input signal.

Non-Patent Documents

Non-Patent Document 1: R. K. Mongia, I. J. Bahl, P. Bhartia, J. Hong, "RF AND MICROWAVE COUPLED-LINE CIRCUITS SECOND EDITION", Artech House (p. 485, FIG. 13.5(c))

Non-Patent Document 2: S. A. Maas and Y. Ryu, "A Broadband, Planar, Monolithic Resistive Frequency Doubler", Microwave and Millimeter-Wave Monolithic Circuits Symposium, 1994. Digest of Papers., IEEE 1994 (p. 177, FIG. 3)

SUMMARY OF THE INVENTION

Technical Problem

However, in the balun described in Non-Patent Document 1, in a case where the balun is connected to an adjacently-disposed electronic circuit in the shortest distance, consideration has not been given to the deterioration in electrical characteristics of the balun due to the electromagnetic effect from the electronic circuit. Further, in the balun described in Non-Patent Document 2, consideration has not been given to the deterioration in electrical characteristics of the input-side balun and the output-side balun due to the mutual electromagnetic effect between circuit elements.

The present invention has been made to solve the above-described problems, and thus, it is an object of the present invention to provide a balance-unbalance converter that reduces the deterioration in electrical characteristics due to the electromagnetic effect from an electronic circuit disposed adjacent to the balance-unbalance converter, and to provide a semiconductor integrated circuit having the same.

Solution to Problem

In order to solve the above problems, according to claim 1 of the present invention, there is provided a balance-unbalance converter (1) for mutually converting a balanced signal and an unbalanced signal, comprising: a substrate (10); an unbalanced line formed on the substrate, the unbalanced line (12) having a first end (12a) at which the unbalanced signal is input or output, and having a second end (12b) that is open; a first balanced line (14) disposed on the substrate in parallel with a line portion (12d) of the unbalanced line from the first end to a midpoint (12c) of the unbalanced line, the first balanced line having a midpoint-side third end (14a) at which the balanced signal is output or input, and having a fourth end (14b) that is grounded; and a second balanced line (16) disposed on the substrate in parallel with a line portion (12e) of the unbalanced line from the second end to the midpoint of the unbalanced line, the second balanced line having a midpoint-side fifth end (16a) at which the balanced signal is output or input, and having a sixth end (16b) that is grounded; wherein the unbalanced line is bent at the midpoint toward an opposite side of the first and second balanced lines.

With this configuration, in the balance-unbalance converter according to claim 1 of the present invention, the unbalanced line is bent at the longitudinal midpoint of the unbalanced line toward the opposite side of the first and second balanced lines, and the first and second balanced lines are disposed in parallel with the bent unbalanced line. Accordingly, even in the case where an electronic circuit is disposed adjacent to the first and second balanced lines side of the balance-unbalance converter, sufficient space (or distance) can be secured between the electronic circuit and the first and second balanced lines. Therefore, it is possible to suppress unnecessary electromagnetic effect from the adjacently-disposed electronic circuit, thereby reducing the deterioration in the electrical characteristics of the balance-unbalance converter.

In the balance-unbalance converter according to claim 2 of the present invention, at least one of the first balanced line and the second balanced line is inclined with respect to a boundary line (T) between the balance-unbalance converter and an electronic circuit (20) that is disposed adjacent to the first and second balanced lines side of the balance-unbalance converter on the substrate.

With this configuration, the balance-unbalance converter according to claim 2 of the present invention can ensure sufficient space between the adjacently-disposed electronic circuit and the at least one of the first and second balanced lines. Therefore, it is possible to suppress unnecessary electromagnetic effect from the adjacently-disposed electronic circuit, thereby reducing the deterioration in the electrical characteristics of the balance-unbalance converter.

In the balance-unbalance converter according to claim 3 of the present invention, an inclination angle (θ1) of the first balanced line with respect to the boundary line is equal to an inclination angle (θ2) of the second balanced line with respect to the boundary line.

With this configuration, the balance-unbalance converter according to claim 3 of the present invention can ensure sufficient space evenly between the adjacently-disposed electronic circuit and the first and second balanced lines. Therefore, it is possible to suppress unnecessary electromagnetic effect from the adjacently-disposed electronic circuit, thereby reducing the deterioration in the electrical characteristics of the balance-unbalance converter.

In the balance-unbalance converter according to claim 4 of the present invention, an inclination angle (θ1) of the first balanced line with respect to the boundary line and an inclination angle (θ2) of the second balanced line with respect to the boundary line are different from each other.

With this configuration, the balance-unbalance converter according to claim 4 of the present invention can optimally suppress unnecessary electromagnetic effect from the adjacently-disposed electronic circuit, thereby reducing the deterioration in the electrical characteristics, for example, by individually setting the inclination angles of the first and second balanced lines according to the arrangement or distribution state of circuit elements arranged in the adjacent electronic circuit.

In the balance-unbalance converter according to claim 5 of the present, invention, an inclination angle (θ1) of the first balanced line with respect to the boundary line and an inclination angle (θ2) of the second balanced line with respect to the boundary line are each less than 75°.

With this configuration, the balance-unbalance converter according to claim 5 of the present invention can suppress unnecessary electromagnetic effect from the adjacent electronic circuit, thereby reducing the deterioration in the electrical characteristics, while restricting the deterioration in the electrical characteristics due to the bending of the unbalanced line to an allowable range.

In the balance-unbalance converter according to claim 6 of the present invention, an inclination angle (θ1) of the first balanced line with respect to the boundary line and an inclination angle (θ2) of the second balanced line with respect to the boundary line are each within a range from 15° to 60°.

With this configuration, the balance-unbalance converter according to claim 6 of the present invention can suppress unnecessary electromagnetic effect from the adjacently-disposed electronic circuit, thereby reducing the deterioration in the electrical characteristics of the balance-unbalance converter.

The semiconductor integrated circuit according to claim 7 of the present invention, includes: the balance-unbalance converter (1) according to claim 1; and an electronic circuit (20) that is disposed adjacent to the first and second balanced lines side of the balance-unbalance converter on the substrate made of semiconductor.

With this configuration, the semiconductor integrated circuit according to claim 7 of the present invention has the balance-unbalance converter according to claim 1, and therefore, the semiconductor integrated circuit can suppress unnecessary electromagnetic effect from the adjacently-disposed electronic circuit, thereby reducing the deterioration in the electrical characteristics of the balance-unbalance converter and the semiconductor integrated circuit having the same.

In the semiconductor integrated circuit according to claim 8 of the present invention, the electronic circuit is a frequency converter.

With this configuration, the semiconductor integrated circuit according to claim 8 of the present invention can suppress unnecessary electromagnetic effect between the balance-unbalance converter and the frequency converter in the semiconductor integrated circuit, thereby reducing the deterioration in the electrical characteristics of the balance-unbalance converter and the semiconductor integrated circuit having the same.

Advantageous Effects of Invention

According to the present invention, it is possible to provide a balance-unbalance converter that reduces the deterioration in electrical characteristics due to the electromagnetic effect from an electronic circuit disposed adjacent to the balance-unbalance converter, and to provide a semiconductor integrated circuit having the same.

DETAILED DESCRIPTION OF THE INVENTION

Embodiments of the present invention will be described hereinafter with reference to the drawings.

Balance-Unbalance Converter

Figure 1:
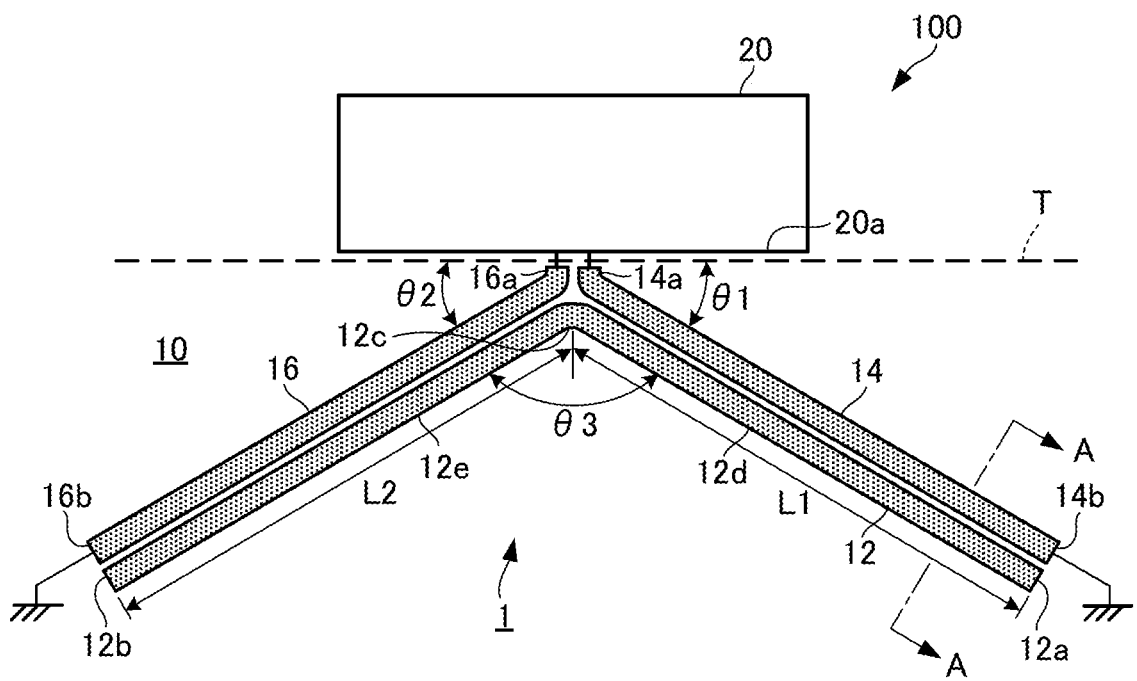
FIG. 1 is a configuration diagram of a balance-unbalance converter according to an embodiment of the present invention.

FIG. 1 is a configuration diagram of a balance-unbalance converter 1 according to an embodiment. The balance-unbalance converter 1 converts an unbalanced signal (single-phase signal) to a balanced signal (differential signal), or converts a balanced signal to an unbalanced signal. Although the case of converting an unbalanced signal to a balanced signal will be described hereinafter, it is also possible to convert a balanced signal to an unbalanced signal simply by reversing input and output.

The balance-unbalance converter 1 includes a substrate 10, an unbalanced line 12, a first balanced line 14, and a second balanced line 16. The unbalanced line 12, the first balanced line 14, and the second balanced line 16 are formed in the same plane on the substrate 10. The substrate 10 is, for example, a substrate made of dielectric material or a semiconductor substrate, but it is not limited thereto. The substrate 10 may be a printed-circuit board depending on the operating band of the balance-unbalance converter 1.

The unbalanced line 12 is a conductor line that transmits an unbalanced signal in single-ended mode. The total length of the unbalanced line 12 in the longitudinal direction is ½ of a wavelength of a high-frequency reference signal. The high-frequency reference signal is, for example, a signal having a center frequency of the operating band of the balance-unbalance converter 1. Letting a total length of the unbalanced line 12 be L and letting a wavelength of the high-frequency reference signal be $\lambda$, then $L=\lambda/2$. The unbalanced signal is input to a first end 12a, which is one end of the unbalanced line 12. A second end 12b, which is the other end of the unbalanced line 12, is open.

The unbalanced line 12 has a straight-line portion (hereinafter referred to as a "first line portion") extending from the first end 12a, which is used for signal input, to a midpoint 12c in the longitudinal direction, and has a straight-line portion (hereinafter referred to as a "second line portion") extending from the second end 12b to the midpoint 12c. The longitudinal length L1 of the first line portion 12d is ¼ of the wavelength $\lambda$ of the high-frequency reference signal. That is, $L1=\lambda/4$. The longitudinal length L2 of the second line portion 12e is equal to the length L1 of the first line portion 12d.

The first balanced line 14 is a straight conductor line and is disposed in parallel with the first line portion 12d of the unbalanced line 12. The first balanced line 14 has the same line length as the length L1 of the first line portion 12d. That is, the first balanced line 14 has a line length of ¼ of the wavelength $\lambda$ of the high-frequency reference signal. The first balanced line 14 has a third end 14a located at the midpoint 12c side of the unbalanced line 12, and a fourth end 14b located at the first end 12a side of the unbalanced line 12. A balanced signal is output from the third end 14a of the first balanced line 14. The fourth end 14b of the first balanced line 14 is connected to a ground terminal.

The second balanced line 16 is a straight conductor line and is disposed in parallel with the second line portion 12e of the unbalanced line 12. The second balanced line 16 has the same line length as the length L2 of the second line portion 12e. That is, the second balanced line 16 has a line length of ¼ of the wavelength $\lambda$ of the high-frequency reference signal. The second balanced line 16 has a fifth end 16a located at the midpoint 12c side of the unbalanced line 12, and a sixth end 16b located at the second end 12b side of the unbalanced line 12. The balanced signal is output from the fifth end 16a of the second balanced line 16. The sixth end 16b of the second balanced line 16 is connected to a ground terminal.

A portion in the vicinity of the third end 14a used for signal output of the first balanced line 14 is smoothly curved in the direction of sending out the output signal such that attenuation of the signal hardly occurs at this portion. Similarly, a portion near the fifth end 16a used for signal output of the second balanced line 16 is smoothly curved in the direction of sending out the output signal such that attenuation of the signal hardly occurs at this portion. The first and second balanced lines 14 and 16 are lines for transmitting a balanced signal on the substrate 10 in a differential manner, and a pair of the third end 14a and the fifth end 16a is arranged to output such a differential signal.

On the substrate 10, an electronic circuit 20 is disposed adjacent to the first and second balanced lines 14, 16 side of the balance-unbalance converter 1. The third end 14a used for signal output of the first balanced line 14 and the fifth end 16a used for signal output of the second balanced line 16 are connected to an input terminal of the electronic circuit 20. A straight boundary line T along the arrangement or disposition direction of the adjacently-disposed electronic circuit 20 can be assumed between the electronic circuit 20 and the balance-unbalance converter 1. For example, in FIG. 1, the boundary line T is set in parallel with a side edge portion 20a at an input side (balance-unbalance converter 1 side) of the electronic circuit 20.

The unbalanced line 12 is bent at an angle $\theta 3$ toward an opposite side of the first and second balanced lines 14 and 16 at the midpoint 12c in the longitudinal direction. The range of $\theta 3$ is $0°\leq\theta 3<180°$. Since the first and second balanced lines 14 and 16 are disposed in parallel with the unbalanced line 12 with a certain distance from the unbalanced line 12, the first balanced line 14 and the second balanced line 16 are also disposed to form the same angle as the angle $\theta 3$. Further, the first balanced line 14 is inclined at an angle $\theta 1$ with respect to the straight boundary line T between the adjacently-disposed electronic circuit 20 and the balance-unbalance converter 1 on the substrate 10. The second balanced line 16 is inclined at an angle $\theta 2$ with respect to the boundary line T between the electronic circuit 20 and the balance-unbalance converter 1. That is, $\theta 1+\theta 2+\theta 3=180°$.

In the present embodiment, the inclination angle $\theta 1$ of the first balanced line 14 with respect to the boundary line T is equal to the inclination angle $\theta 2$ of the second balanced line 16 with respect to the boundary line T. The inclination angles $\theta 1$ and $\theta 2$ may be different from each other depending on the arrangement or distribution state of the circuit elements constituting the adjacently-disposed electronic circuit 20. For example, when many inductive circuit elements are disposed at the side of the first balanced line 14, it is preferable to set the inclination angle $\theta 1$ larger than the inclination angle $\theta 2$.

Figure 2:
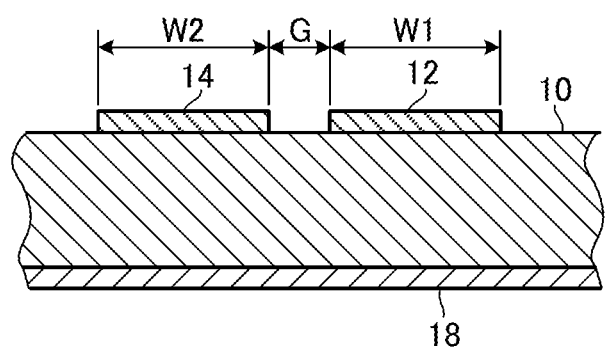
FIG. 2 is a cross-sectional view taken along line A-A of FIG. 1.

FIG. 2 is a cross-sectional view taken along line A-A in FIG. 1. As shown in FIG. 2, the unbalanced line 12 is a conductor pattern linearly formed having a width W on the substrate 10, and the first balanced line 14 is a conductor pattern linearly formed having a width W2 on the substrate 10. Similarly, the second balanced line 16 is a conductor pattern linearly formed on the substrate 10, having the same width as the width W2 of the first balanced line 14. The first and second balanced lines 14 and 16 are disposed in parallel with the unbalanced line 12 with a constant interval G. On the back surface of the substrate 10, a metal ground layer 18 is formed. Although the unbalanced line 12 and the first and second balanced lines 14 and 16 are formed as microstrip lines, they may be formed as strip lines. The unbalanced line 12 and the first and second balanced lines 14 and 16 are disposed in the same plane and are electromagnetically coupled mainly by edge coupling.

For example, the first balanced line 14 and the second balanced line 16 have the same width W2 of 15 µm and the same length L1 (or L2) of 330 µm and the unbalanced line 12 has the width W1 of 15 µm and a total length L of 660 µm. Further, for example, the interval (gap) G between the first and second balanced lines 14, 16 and the unbalanced line 12 is 5 µm.

With the above-described configuration, the first line portion 12d of the unbalanced line 12 and the first balanced line 14 are electromagnetically coupled to each other, and the second line portion 12e of the unbalanced line 12 and the second balanced line 16 are electromagnetically coupled to each other.

Next, the operation of the balance-unbalance converter 1 will be described. In FIG. 1, an unbalanced signal input from the first end 12a of the unbalanced line 12 is transmitted from the unbalanced line 12 to the first balanced line 14 and the second balanced line 16 by electromagnetic coupling. Specifically, since the length of the first balanced line 14 is ¼ wavelength, the phase of the signal output from the third end 14a used for signal output is rotated by 90° with respect to the input signal. On the other hand, the signal that has reached the second end 12b through the unbalanced line 12 is rotated by 180° in phase with respect to the input signal. The signal reflected at the second end 12b passes through the second balanced line 16 and is output from the fifth end 16a used for signal output Since the length of the second balanced line 16 is ¼ wavelength, the phase of the signal output from the fifth end 16a is rotated by 270° with respect to the input signal. That is, the signal output from the third terminal 14a and the signal output from the fifth terminal 16a have phases opposite by 180° from each other. In this way, the unbalanced signal is converted to a balanced signal and the balanced signal is output from the third end 14a and the fifth end 16a.

With the above-described configuration, in the balance-unbalance converter 1 according to the present embodiment, the unbalanced line 12 is bent at the longitudinal midpoint 12c thereof at an angle θ3 toward the opposite side of the first and second balanced lines 14 and 16, and the first and second balanced lines 14 and 16 are also disposed along the unbalanced line 12 so as to form the same angle as the angle θ3. Accordingly, when the electronic circuit 20 is disposed adjacent to the balance-unbalance converter 1, the first balanced line 14 and the second balanced line 16 are inclined at the inclination angles θ1 and θ2, respectively, with respect to the boundary line T between the electronic circuit 20 and the balance-unbalance converter 1. As a result, even when the electronic circuit 20 is disposed adjacent to the first and second balanced lines 14 and 16 side of the balance-unbalance converter 1, sufficient space (distance) can be secured between the electronic circuit 20 and the first and second balanced lines 14 and 16, and therefore, it is possible to suppress unnecessary electromagnetic effect from the electronic circuit 20, thereby reducing the deterioration in the electrical characteristics of the balance-unbalance converter 1.

Semiconductor Integrated Circuit

Figure 3:
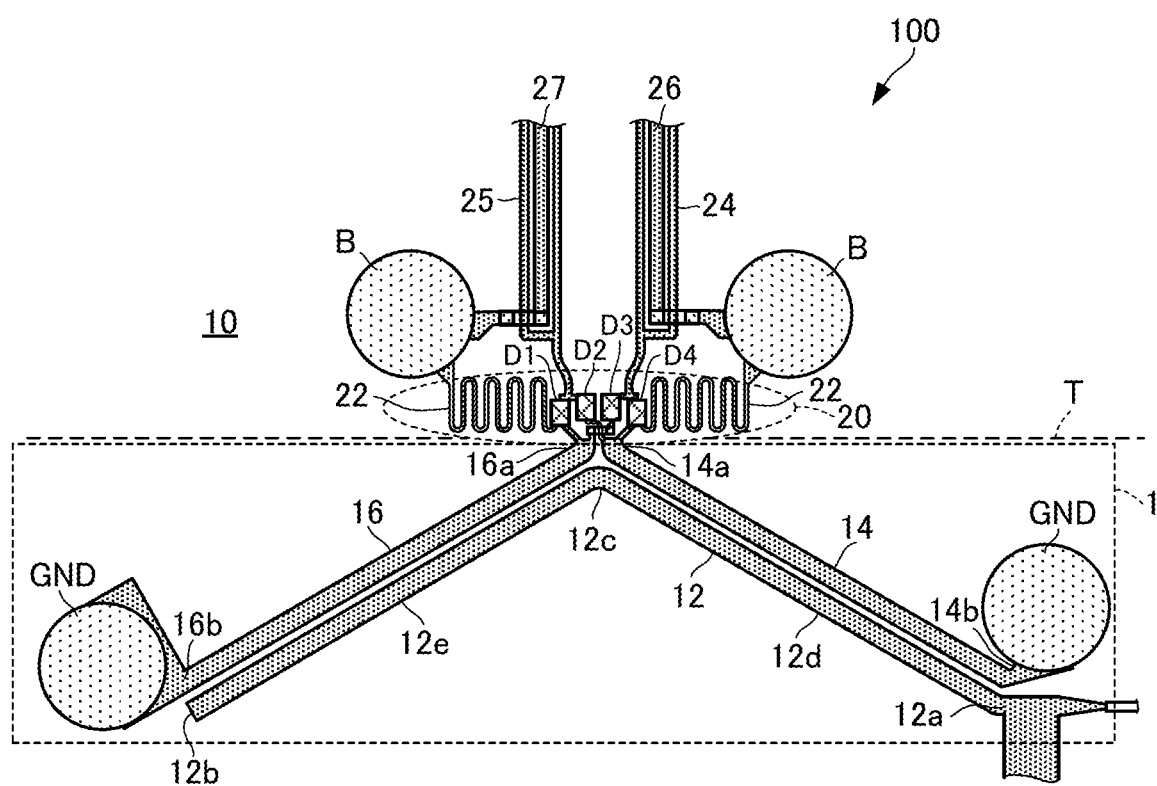
FIG. 3 is a configuration diagram of a semiconductor integrated circuit according to an embodiment of the present invention.

FIG. 3 is a configuration diagram of a semiconductor integrated circuit 100 according to an embodiment. The semiconductor integrated circuit 100 includes a balance-unbalance converter 1 and an electronic circuit 20 on a substrate 10, which is a semiconductor substrate.

The balance-unbalance converter 1 has the same structure as that described above with reference to FIGS. 1 and 2, and specifically includes an unbalanced line 12, a first balanced line 14 and a second balanced line 16. An unbalanced signal is input to a first end 12a of the unbalanced line 12. A high-frequency balanced signal obtained by the balance-unbalance conversion is output from a third end 14a of the first balanced line 14 and a fifth end 16a of the second balanced line 16. A fourth end 14b of the first balanced line 14 and a sixth end 16b of the second balanced line 16 are connected to ground terminals GND.

The electronic circuit 20 is a mixer (frequency converter) that performs a multiplication operation of a frequency f1 of the high-frequency signal sent from the balance-unbalance converter 1 and a frequency f2 of another high-frequency signal to output the sum and difference of the frequencies. A part of the mixer is shown in FIG. 3. The mixer includes four diodes D1, D2, D3, and D4 connected in a bridge shape and two meander lines 22. The four diodes D to D4 connected in a bridge shape have a switching function. The meander lines 22 include serpentine lines, which are inductive circuit elements.

The third end 14a for signal output of the first balanced line 14 of the balanced unbalance converter 1 is connected to the diodes D2 and D4. The fifth end 16a for signal output of the second balanced line 16 is connected to the diodes D1 and D3. The diode D1 is connected to the ground layer via one of the meander lines 22 and a via-hole B, and the diode D4 is connected to the ground layer via the other of the meander lines 22 and a via-hole B. Further, an output line 24 of the electronic circuit 20 is connected to the diodes D3 and D4, and an output line 25 is connected to the diodes D1 and D2. The lines 26 and 27 are connected to the ground layer via the via-holes B.

Figure 4:
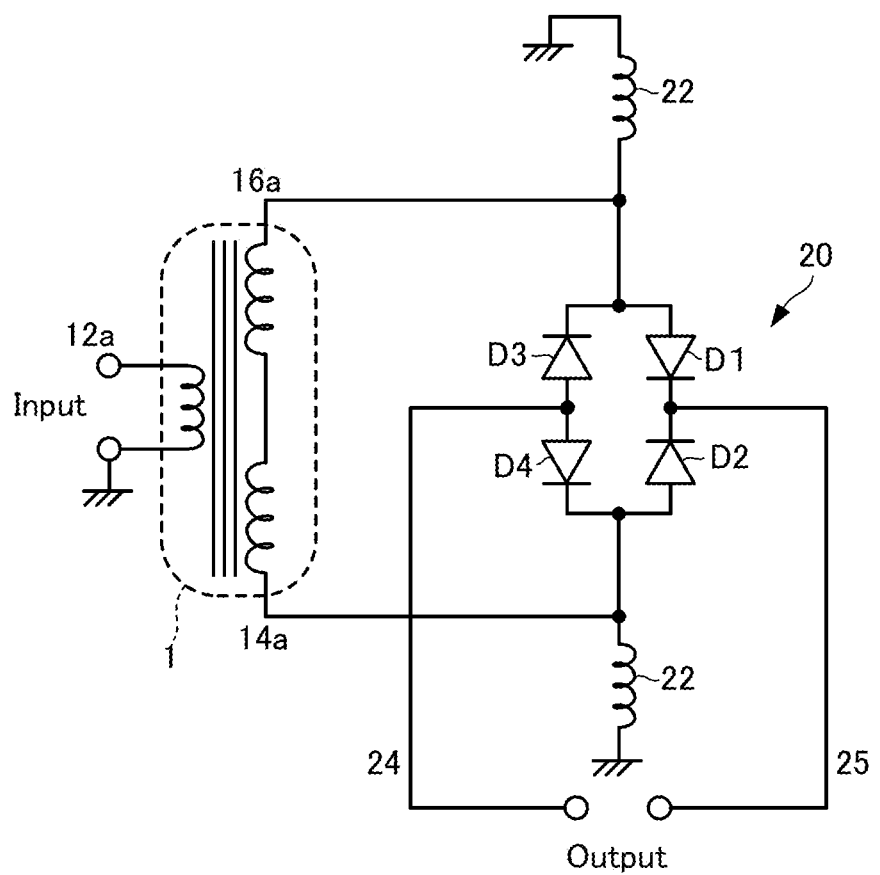
FIG. 4 is an electric equivalent circuit of the semiconductor integrated circuit of FIG. 3.

FIG. 4 is an electric equivalent circuit of the semiconductor integrated circuit 100 of FIG. 3. As shown in FIG. 4, the balance-unbalance converter 1 has a function equivalent to the function of a transformer that converts an unbalanced signal to a balanced signal at an input side of the electronic circuit 20. Specifically, an unbalanced signal having a frequency f1 to be input to the semiconductor integrated circuit 100 is input to the first end 12a used for signal input of the unbalanced line 12 of the balance-unbalance converter 1. In the balance-unbalance converter 1, the input unbalanced signal is converted into a balanced signal, and the balanced signal is output from the third end 14a and the fifth end 16a used for signal output of the first and second balanced lines 14 and 16 to the electronic circuit 20. The output balanced signal is sent to the diodes D1 to D4 connected in a bridge shape. Another balance-unbalance converter (not shown) to which a signal having a frequency f2 is input is disposed at the rear stage of the lines 24 and 25 of the electronic circuit 20. A signal having a frequency f1±f2 obtained by multiplying the input signal having the frequency f1 and the input signal having the frequency f2 is output through the line 24 connected to the diodes D3 and D4 and the line 25 connected to the diodes D1 and D2.

An anode of the diode D1 and a cathode of the diode D3 are connected to the ground layer via one meander line 22 and one of the via-holes B. Likewise, an anode of the diode D2 and a cathode of the diode D4 are connected to the ground layer via the other meander line 22 and one of the via-holes B. These meander lines 22, which are used as inductive circuit elements, adjust the electrical characteristics of the electronic circuit 20.

In the above description, although the balance-unbalance converter 1 has been described as a device converting an unbalanced signal to a balanced signal, it is not limited to this signal conversion. A balanced signal may be converted into an unbalanced signal by the balance-unbalance converter 1. Specifically, the third end 14*a* of the first balanced line 14 and the fifth end 16*a* of the second balanced line 16 are used for inputting a high-frequency signal, and the first end 12*a* of the unbalanced line 12 is used for signal output.

Next, simulation results regarding the pass characteristics of the balance-unbalance converters according to some working examples of the present invention will be described.

Comparative Example

First, for comparison, in a case where the inclination angle θ1 of the first balanced line 14 with respect to the boundary line T is 0° and the inclination angle θ2 of the second balanced line 16 with respect to the boundary line T is 0°, that is, the balance-unbalance converter has a straight-line structure, the simulation results will be described.

Figure 5A:
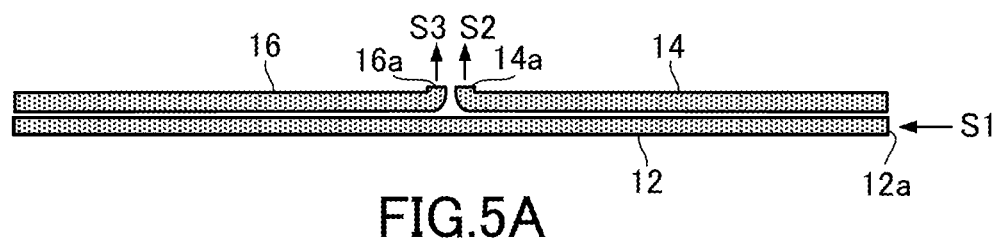
FIGS. 5A and 5B are configuration diagrams of a balance-unbalance converter according to a comparative example.
Figure 5B:
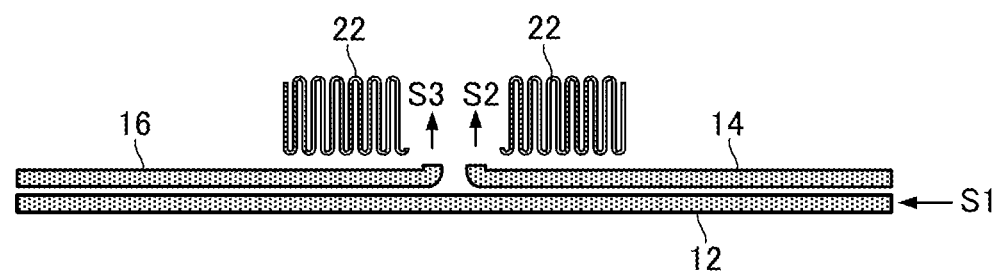

FIGS. 5A and 5B show the configuration of a balance-unbalance converter according to the comparative example. FIG. 5A shows a case where meander lines 22, which are inductive circuit elements, do not exist adjacent to the balance-unbalance converter, and FIG. 5B shows a case where two meander lines 22 exist adjacent to the balance-unbalance converter. The meander lines 22 correspond to the electronic circuit 20 disposed adjacently in the present embodiment.

In the simulation, the width W1 of the unbalanced line 12 and the width W2 of the first and second balanced lines 14 and 16 were all set to 15 μm, the interval (gap) G between the unbalanced line 12 and the first and second balanced lines 14 and 16 was set to 5 μm, and the total length L of the unbalanced line 12 was set to 660 μm. Further, the substrate was assumed to be a gallium arsenide semiconductor substrate. These simulation conditions are common to all of the comparative examples and the working examples described below.

Figure 6A:
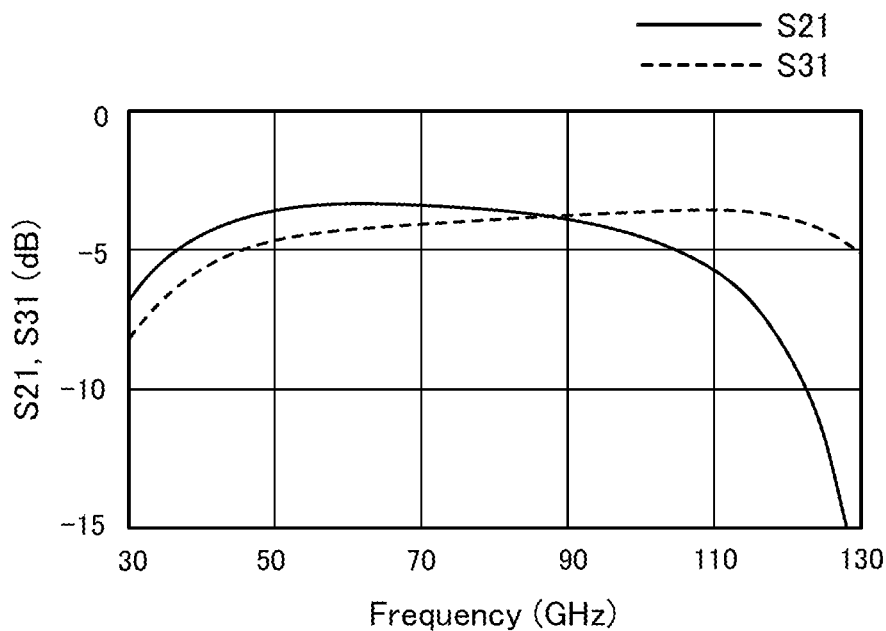
FIGS. 6A and 6B show simulation results of pass characteristics in the comparative example.
Figure 6B:
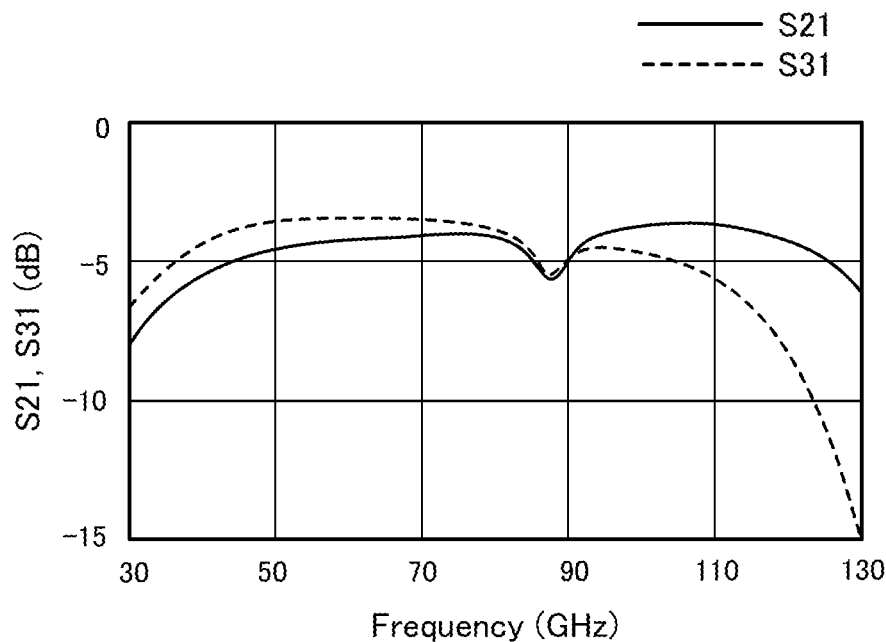

FIG. 6A shows the simulation results of the pass characteristics on the condition that both the inclination angles are 0° and no meander lines exist, as shown in FIG. 5A. FIG. 6B shows the simulation results of the pass characteristics on the condition that both the inclination angles are 0° and meander lines exist, as shown in FIG. 5B.

In FIGS. 6A and 6B, S21 indicated by a solid line shows the pass characteristics (pass amount) in dB unit of an output signal S2 which was output from the third end 14*a* used for signal output of the first balanced line 14, with respect to an input signal S1 which was input into the first end 12*a* used for signal input of the unbalanced line 12. S31 indicated by a broken line shows the pass characteristics (pass amount) in dB unit of an output signal S3 which was output from the fifth end 16*a* used for signal output of the second balanced line 16, with respect to the input signal S1 which was input into the first end 12*a* used for signal input of the unbalanced line 12. The above-stated notation also applies to the working examples described later.

As shown in FIG. 6A, in the case of the balance-unbalance converter having a straight-line structure, when any adjacent meander lines do not exist, for example, at a frequency of 50 to 90 GHz, the pass characteristics S21 and S31 are both greater than −5 dB, and thus the insertion loss is small. Generally, if the pass characteristics are, for example, about −5 dB or more in the assumed operating band, balance-unbalance converters having such pass characteristics can be sufficiently used as a high frequency circuit.

On the other hand, as shown in FIG. 6B, when meander lines exist adjacent to the balance-unbalance converter having a straight-line structure, a dip appears below −5 dB at or just before 90 GHz in both of the pass characteristics S21 and S31. That is, in the case of the balance-unbalance converter having a straight-line structure, it can be understood that the pass characteristics are deteriorated by the electromagnetic effect from the electronic circuit disposed adjacent to the balance-unbalance converter.

Working Example 1

Figure 7A:
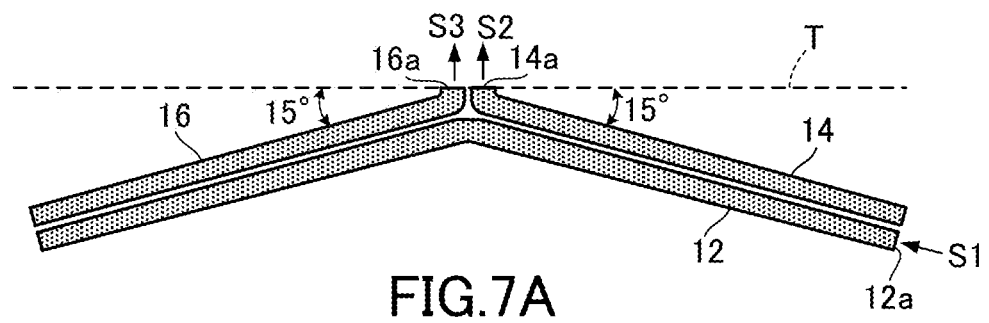
FIGS. 7A and 7B are configuration diagrams of a balance-unbalance converter according to a working example 1.
Figure 7B:
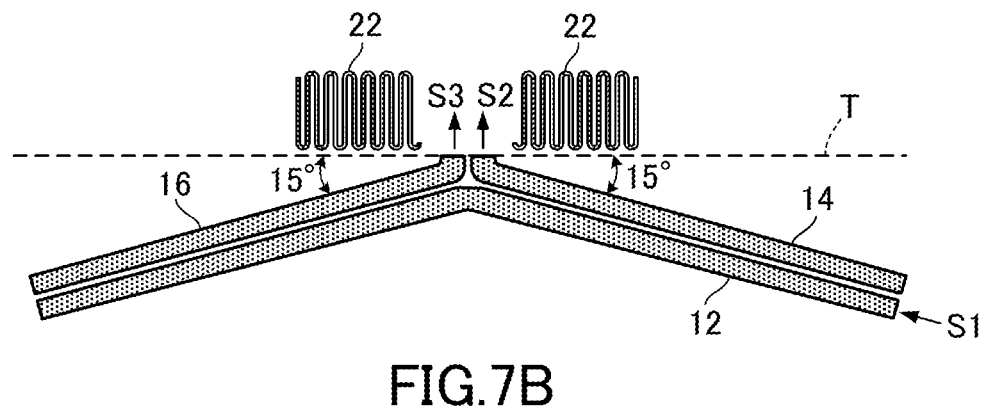

FIGS. 7A and 7B show the configuration of a balance-unbalance converter according to a working example 1. In the working example 1, each of the first and second balanced lines 14 and 16 is inclined at an angle of 15° from the boundary line T between the adjacent electronic circuit and the balance-unbalance converter. FIG. 7A shows a case where no meander lines 22 exist adjacent to the balance-unbalance converter, and FIG. 7B shows a case where two meander lines 22 exist adjacent to the balance-unbalance converter.

Figure 8A:
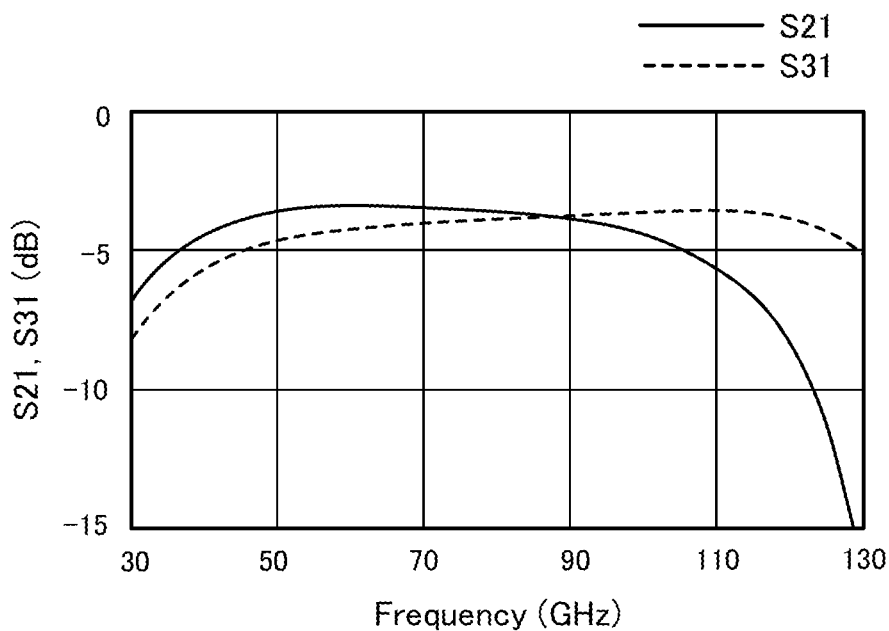
FIGS. 8A and 8B show simulation results of pass characteristics in the working example 1.
Figure 8B:
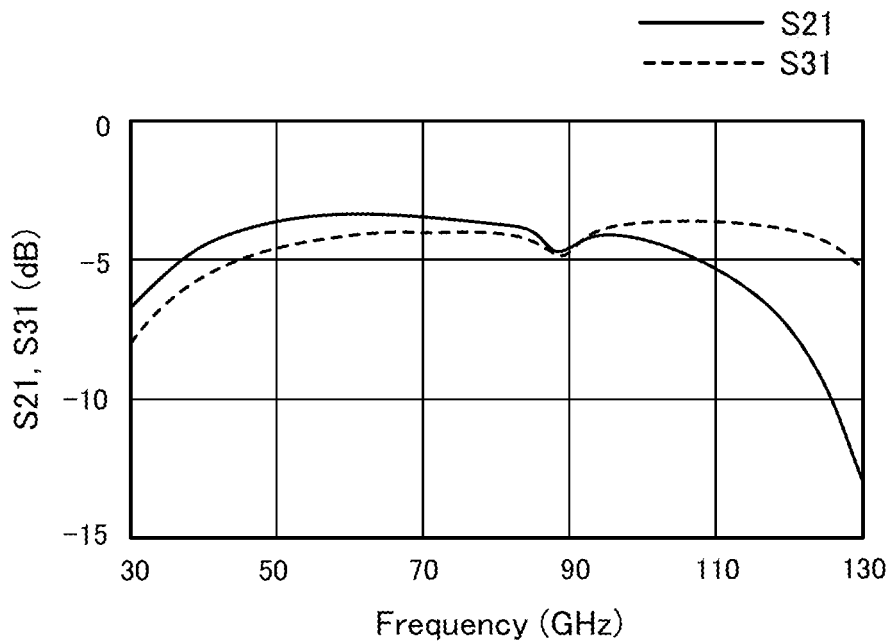

FIG. 8A shows the simulation results of the pass characteristics on the condition that both the inclination angles are 15° and no meander lines exist, as shown in FIG. 7A. FIG. 8B shows the simulation results of the pass characteristics on the condition that both the inclination angles are 15° and meander lines exist, as shown in FIG. 7B.

As shown in FIG. 8A, when both the inclination angles are 15° and no meander lines exist, it can be understood that both of the pass characteristics S21 and S31 are above −5 dB, for example, in the frequency range from 50 to 90 GHz, and thus the insertion loss is small similarly to the balance-unbalance converter having a straight-line structure.

On the other hand, as shown in FIG. 8B, in the case where both the inclination angles are 15° and meander lines exist, although a dip appears at or just before 90 GHz in both of the pass characteristics S21 and S31, the pass characteristics at the dip do not fall below −5 dB, and the drop at the dip is smaller as compared with the balance-unbalance converter having a straight-line structure. That is, in the case of the balance-unbalance converter having the inclination angles of 15°, it can be understood that the insertion loss is small similarly to the balance-unbalance converter having the straight-line structure, and thus the deterioration of the pass characteristics due to the electromagnetic effect from the adjacent electronic circuit is reduced.

Working Example 2

Figure 9A:
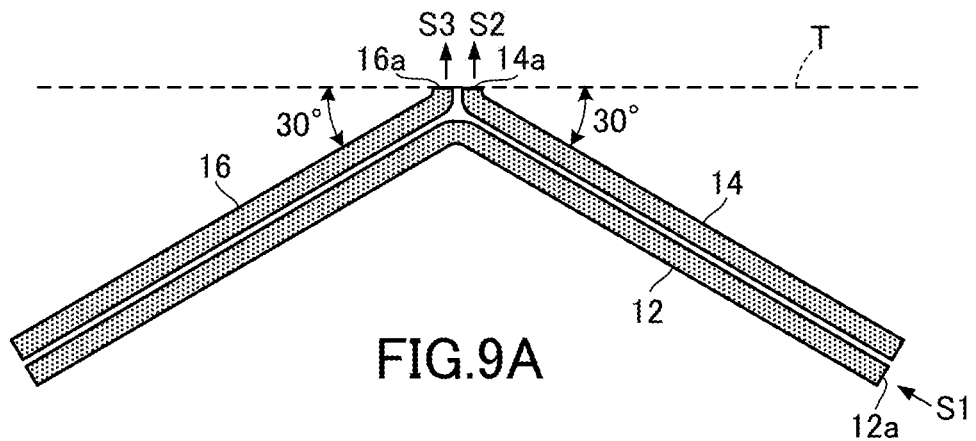
FIGS. 9A and 9B are configuration diagrams of a balance-unbalance converter according to a working example 2.
Figure 9B:
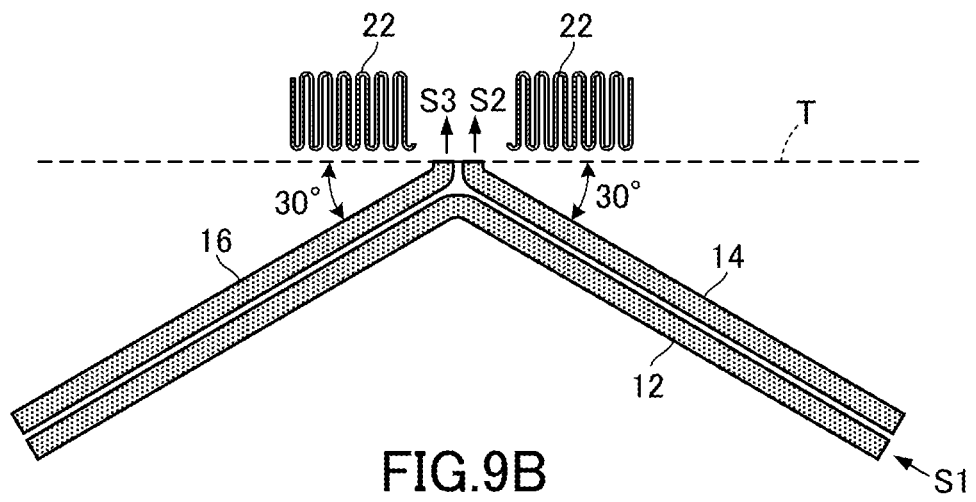

FIGS. 9A and 9B show the configuration of a balance-unbalance converter according to a working example 2. In the working example 2, each of the first and second balanced lines 14 and 16 is inclined at an angle of 30° from the boundary line T between the adjacent electronic circuit and the balance-unbalance converter. FIG. 9A shows a case where no meander lines 22 exist adjacent to the balance-unbalance converter, and FIG. 9B shows a case where two meander lines 22 exist adjacent to the balance-unbalance converter.

Figure 10A:
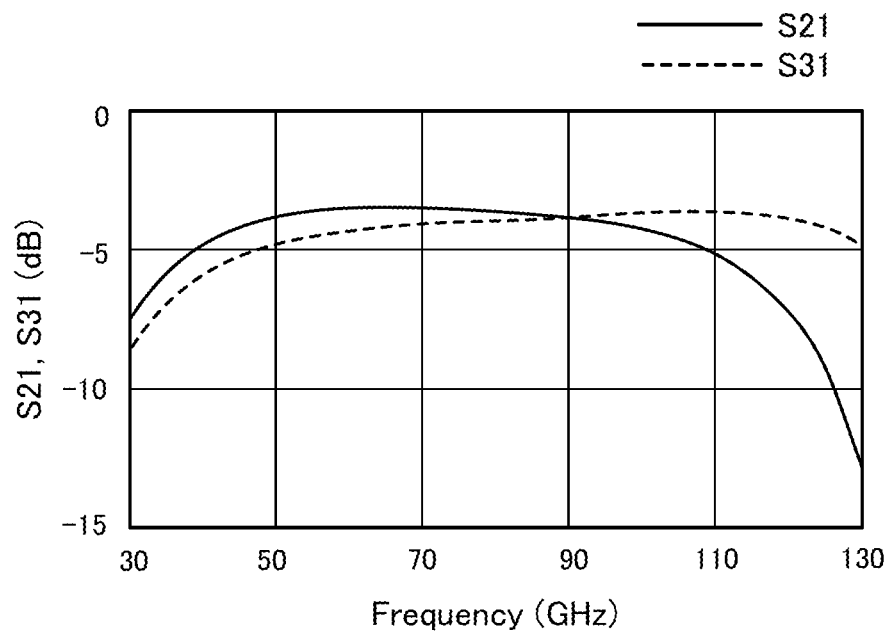
FIGS. 10A and 10B show simulation results of pass characteristics in the working example 2.
Figure 10B:
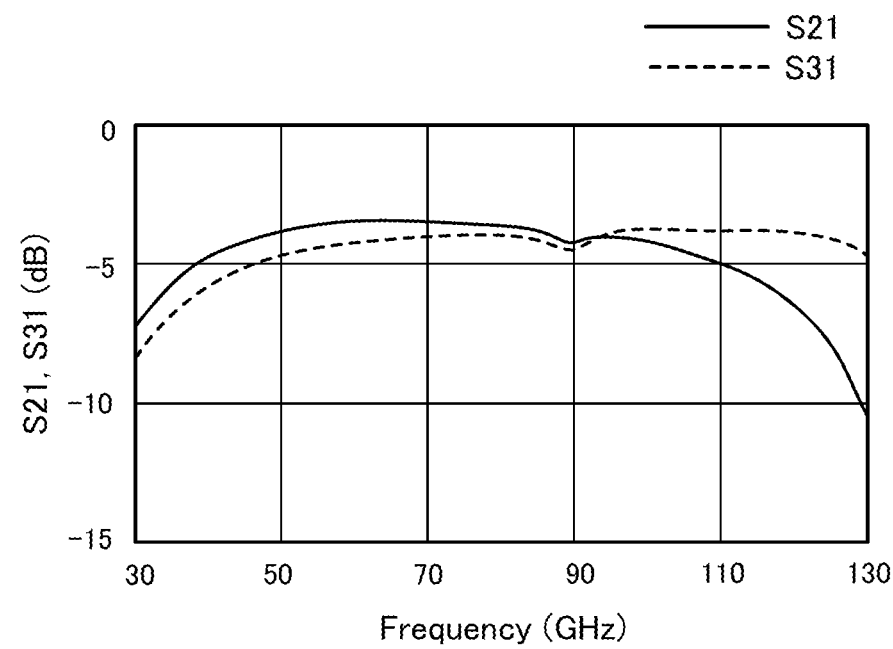

FIG. 10A shows the simulation results of the pass characteristics on the condition that both the inclination angles are 30° and no meander lines exist, as shown in FIG. 9A. FIG. 10B shows the simulation results of the pass characteristics on the condition that both the inclination angles are 30° and meander lines exist, as shown in FIG. 9B.

As shown in FIG. 10A, in the case where both the inclination angles are 30° and no meander lines exist, it can be understood that both of the pass characteristics S21 and S31 are above −5 dB for example in the frequency range from 50 to 90 GHz, and thus the insertion loss is small similarly to the balance-unbalance converter having a straight-line structure.

On the other hand, as shown in FIG. 10B, in the case where both the inclination angles are 30° and meander lines exist, although a dip appears around 90 GHz in both the pass characteristics S21 and S31, the pass characteristics S21 and S31 do not fall below −5 dB, and the dip is small as compared with the balance-unbalance converter having a straight-line structure. In other words, in the case of the balance-unbalance converter having the inclination angles of 30°, the insertion loss is small similarly to the balance-unbalance converter having a straight-line structure, and thus the deterioration in the pass characteristics due to the electromagnetic effect from the adjacent electronic circuit is reduced.

Working Example 3

Figure 11A:
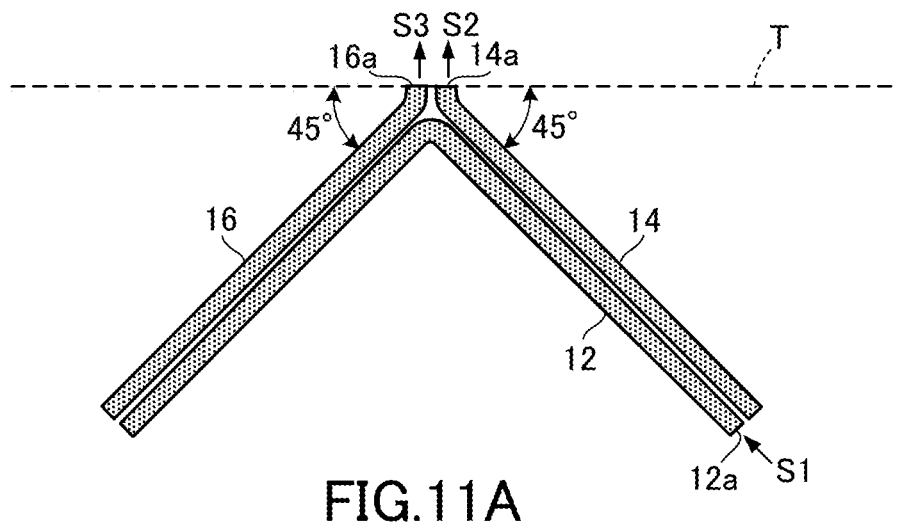
FIGS. 11A and 11B are configuration diagrams of a balance-unbalance converter according to a working example 3.
Figure 11B:
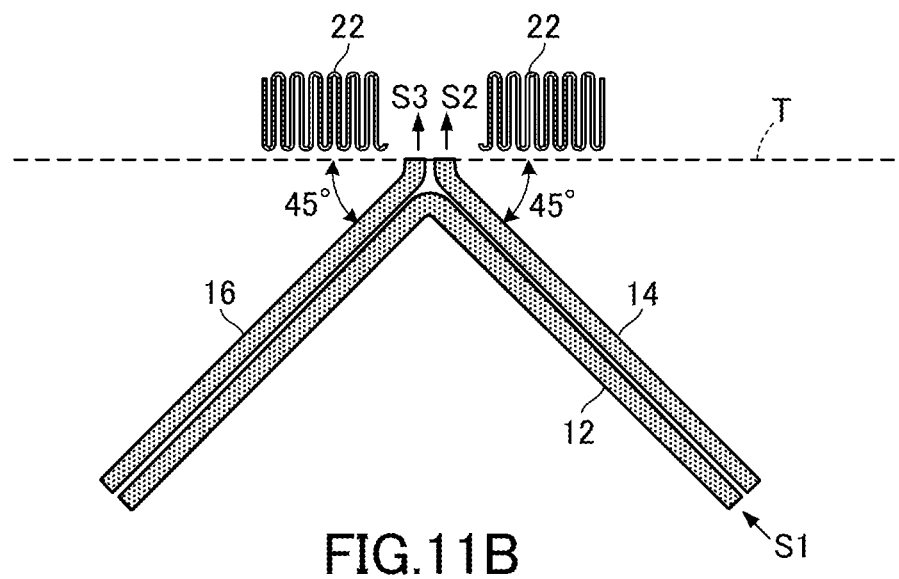

FIGS. 11A and 11B show the configuration of a balance-unbalance converter according to a working example 3. In the working example 3, each of the first and second balanced lines 14 and 16 is inclined at an angle of 45° from the boundary line T between the adjacent electronic circuit and the balance-unbalance converter. FIG. 11A shows a case where no meander lines 22 exist adjacent to the balance-unbalance converter, and FIG. 11B shows a case where two meander lines 22 exist adjacent to the balance-unbalance converter.

Figure 12A:
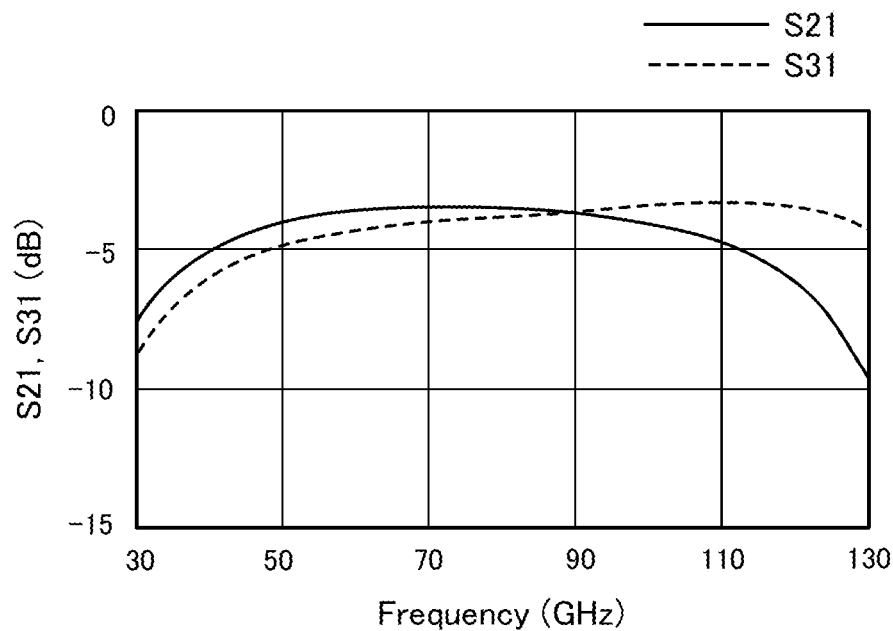
FIGS. 12A and 12B show simulation results of pass characteristics in the working example 3.

FIG. 12A shows the simulation results of the pass characteristics on the condition that both the inclination angles are 45° and no meander lines exist, as shown in FIG. 11A. FIG. 128 shows the simulation results of the pass characteristics on the condition that both the inclination angles are 45° and meander lines exist, as shown in FIG. 11B.

As shown in FIG. 12A, in the case where both the inclination angles are 45° and no meander lines exist, it can be understood that both of the pass characteristics S21 and S31 are above −5 dB for example in almost all the frequency range from 50 to 90 GHz, and thus the insertion loss is small almost similarly to the balance-unbalance converter having a straight-line structure.

Figure 12B:
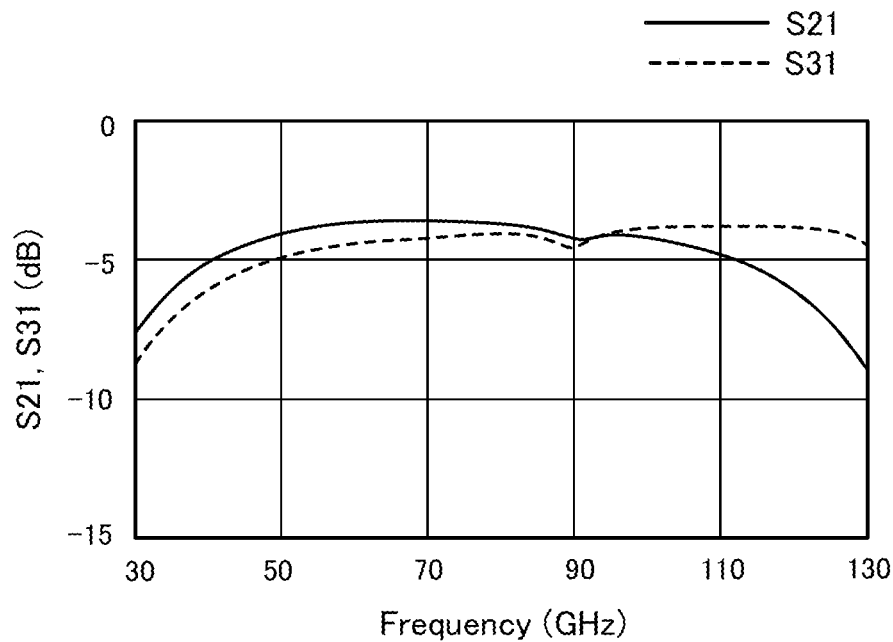

On the other hand, as shown in FIG. 12B, in the case where both the inclination angles are 45° and meander lines exist, although a dip appears in the vicinity of 90 GHz for both of the pass characteristics S21 and S31, the pass characteristics S21 and S31 do not fall below −5 dB, and the drop is small as compared with the balance-unbalance converter having a straight-line structure. In other words, in the case of the balance-unbalance converter having the inclination angles of 45°, the insertion loss is small similarly to the balance-unbalance converter having a straight-line structure, and thus the deterioration in the pass characteristics due to the electromagnetic effect from the adjacent electronic circuit is reduced.

Working Example 4

Figure 13A:
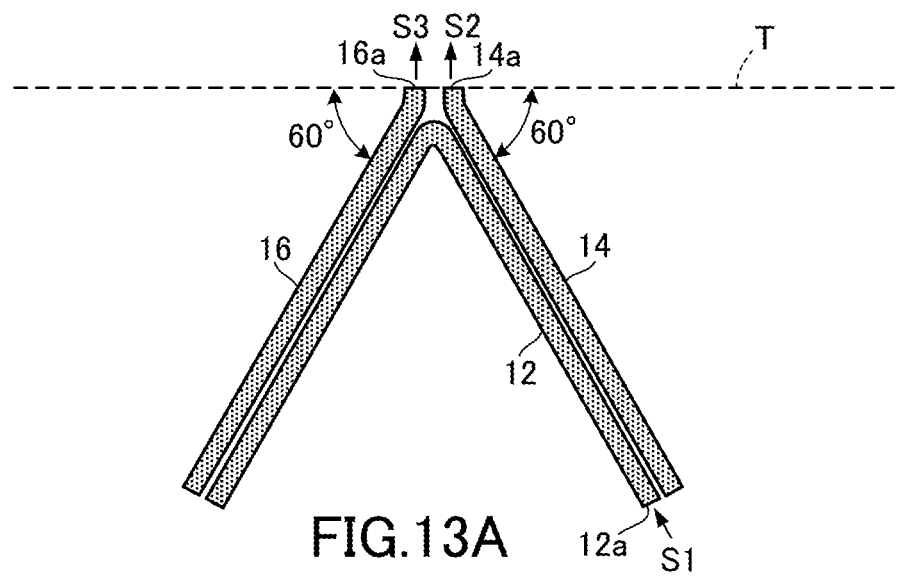
FIGS. 13A and 13B are configuration diagrams of a balance-unbalance converter according to a working example 4.
Figure 13B:
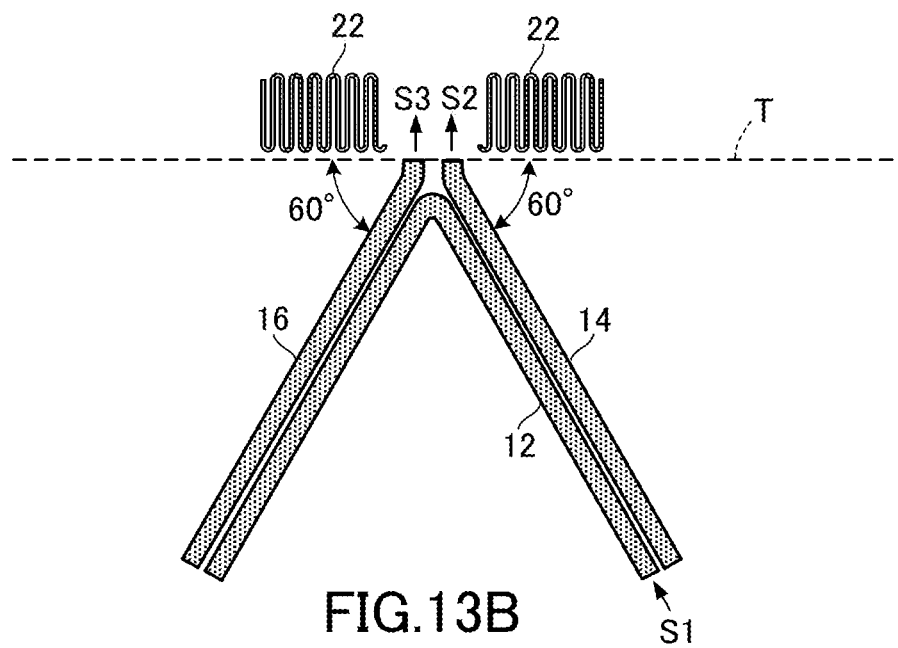

FIGS. 13A and 13B show the configuration of a balance-unbalance converter according to a working example 4. In the working example 4, each of the first and second balanced lines 14 and 16 is inclined at an angle of 60° from the boundary line T between the adjacent electronic circuit and the balance-unbalance converter. FIG. 13A shows a case where no meander lines 22 exist adjacent to the balance-unbalance converter, and FIG. 13B shows a case where two meander lines 22 exist adjacent to the balance-unbalance converter.

Figure 14A:
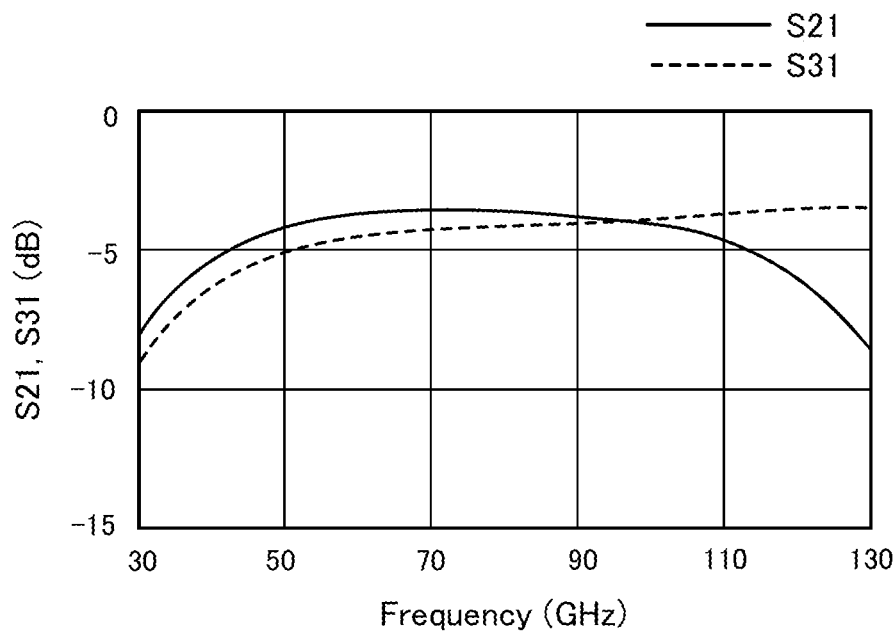
FIGS. 14A and 14B show simulation results of pass characteristics in the working example 4.
Figure 14B:
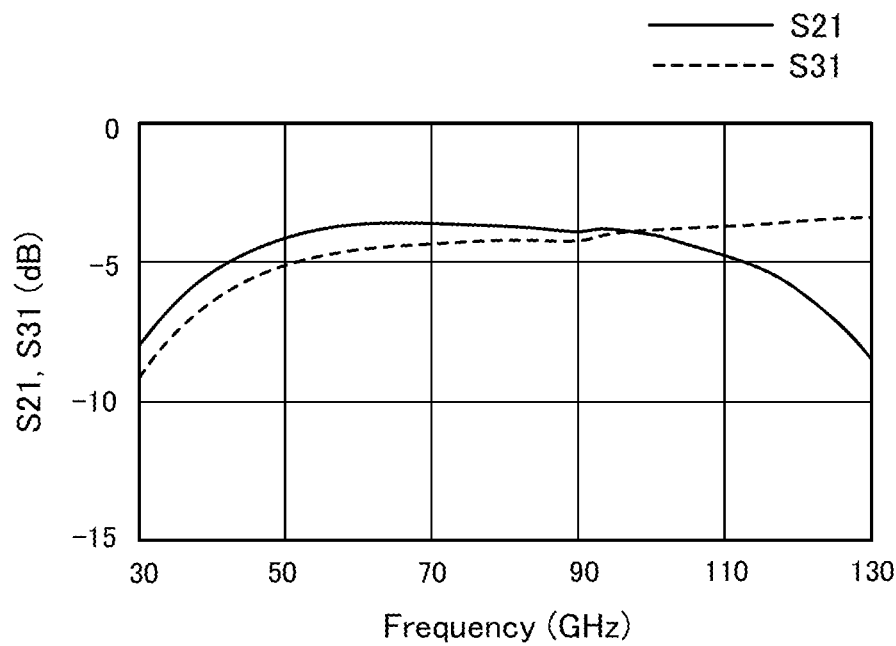

FIG. 14A shows the simulation results of the pass characteristics on the condition that both the inclination angles are 60° and no meander lines exist, as shown in FIG. 13A. FIG. 14B shows the simulation results of the pass characteristics on the condition that both the inclination angles are 60° and meander lines exist, as shown in FIG. 13B.

As shown in FIG. 14A, in the case where both the inclination angles are 60° and no meander lines exist, it can be understood that both of the pass characteristics S21 and S31 are above −5 dB, for example, in almost all of the frequency range from 50 to 90 GHz, and thus the insertion loss is small similarly to the straight-line-structure balance-unbalance converter.

On the other hand, as shown in FIG. 14B, in the case where both the inclination angles are 60° and meander lines exist, although a small dip appears at or before 90 GHz, the pass characteristics at the dip do not fall below −5 dB and the drop in the pass characteristics at the dip is small as compared with the straight-line-structure balance-unbalance converter. In other words, in the case of the balance-unbalance converter having the inclination angles of 60°, the insertion loss is small similarly to the straight-line-structure balance-unbalance converter, and thus the deterioration in the pass characteristics due to the electromagnetic effect from the adjacent electronic circuit is reduced.

Working Example 5

Figure 15A:
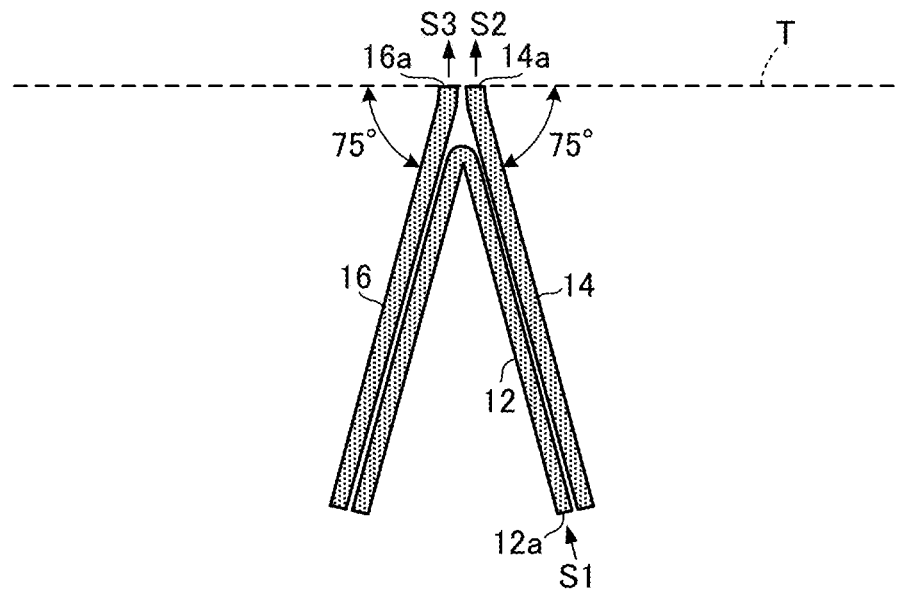
FIGS. 15A and 15B are configuration diagrams of a balance-unbalance converter according to a working example 5.
Figure 15B:
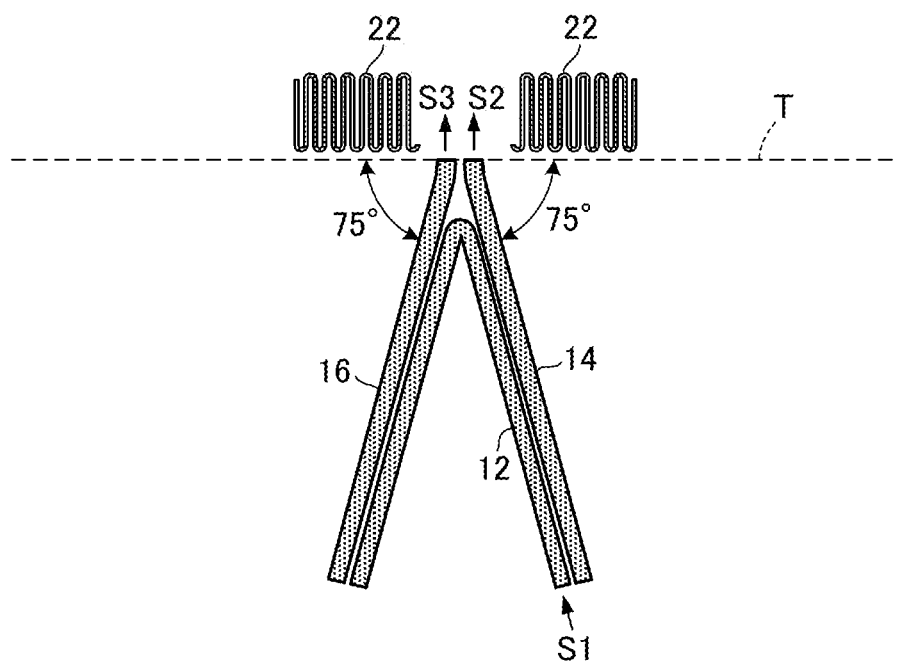

FIGS. 15A and 15B show the configuration of a balance-unbalance converter according to a working example 5. In the working example 5, each of the first and second balanced lines 14 and 16 is inclined at an angle of 75° from the boundary line T between the adjacent electronic circuit and the balance-unbalance converter. FIG. 15A shows a case where no meander lines 22 exist adjacent to the balance-unbalance converter, and FIG. 15B shows a case where two meander lines 22 exist adjacent to the balance-unbalance converter.

Figure 16A:
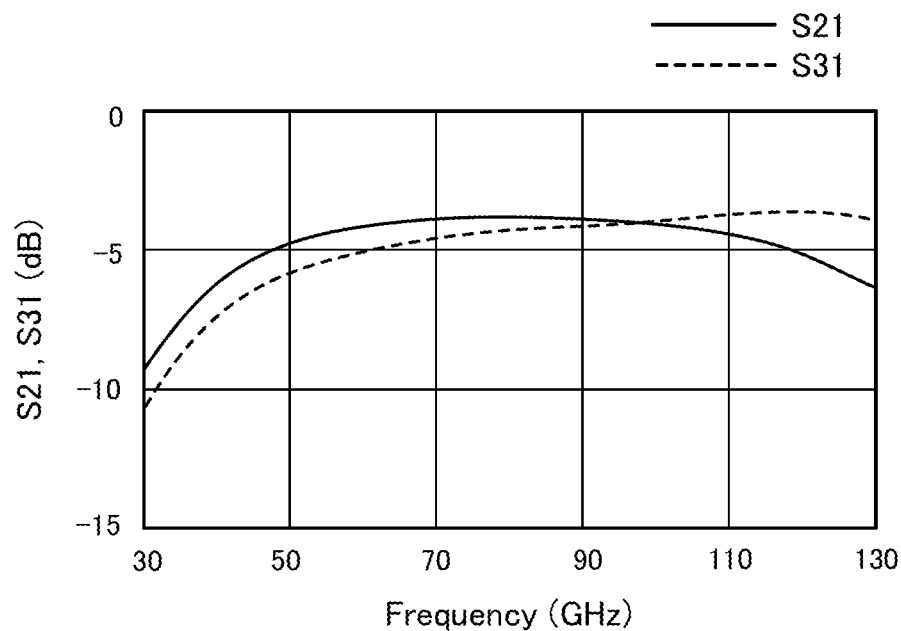
FIGS. 16A and 16B show simulation results of pass characteristics in the working example 5.
Figure 16B:
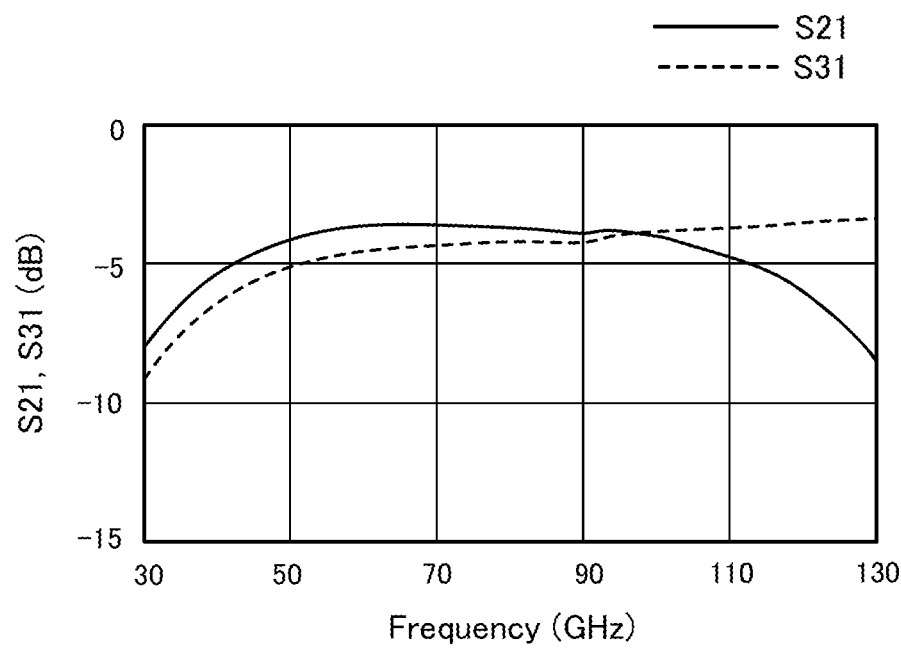

FIG. 16A shows the simulation results of the pass characteristics on the condition that both the inclination angles are 75° and no meander lines exist, as shown in FIG. 15A. FIG. 16B shows the simulation results of the pass characteristics on the condition that both the inclination angles are 75° and meander lines exist, as shown in FIG. 15B.

As shown in FIG. 16A, in the case where both the inclination angles are 75° and no meander lines exist, the pass characteristic S31 falls below −5 dB in the frequency range from 50 to 60 GHz, and thus the insertion loss is large in this frequency range.

On the other hand, as shown in FIG. 16B, in the case where both the inclination angles are 750 and meander lines exist, there is almost no dip in both the pass characteristics S21 and S31. That is, in the case of the balance-unbalance converter having the inclination angles of 75°, although the deterioration in the pass characteristics due to the electromagnetic effect from the adjacent electronic circuit is reduced, the signal attenuation is large as compared with the straight-line-structure balance-unbalance converter.

Working Example 6

Figure 17A:
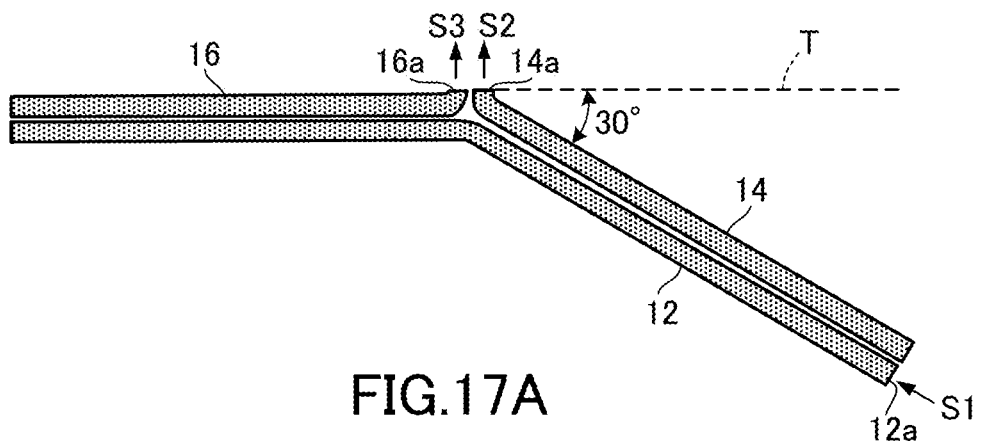
FIGS. 17A and 17B are configuration diagrams of a balance-unbalance converter according to a working example 6.
Figure 17B:
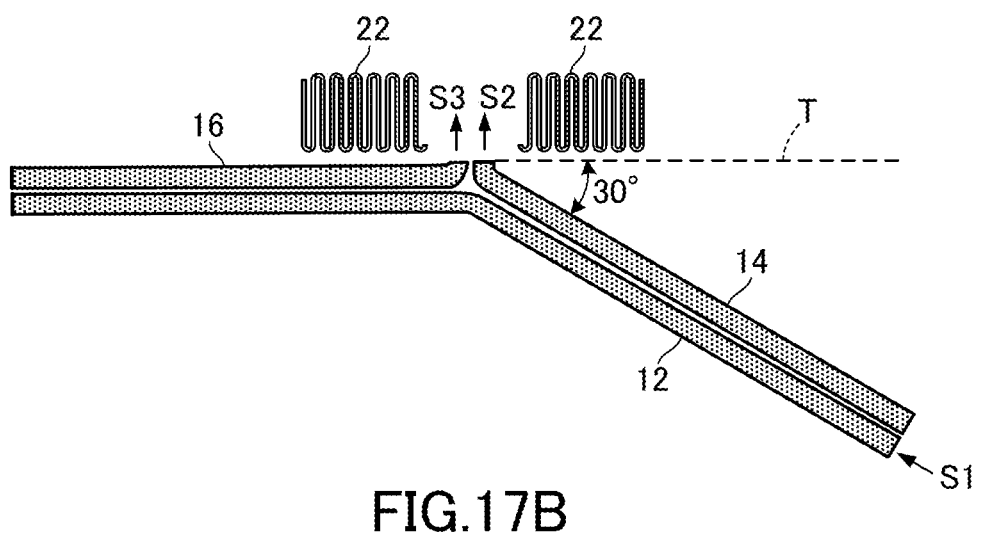

FIGS. 17A and 17B show the configuration of a balance-unbalance converter according to a working example 6. In the working example 6, the inclination angle θ1 of the first balanced line 14 is 30° and the inclination angle θ2 of the second balanced line 16 is 0°. That is, only the first balanced line 14 is inclined with respect to the boundary line T. FIG. 17A shows a case where no meander lines 22 exist adjacent to the balance-unbalance converter, and FIG. 17B shows a case where two meander lines 22 exist adjacent to the balance-unbalance converter.

Figure 18A:
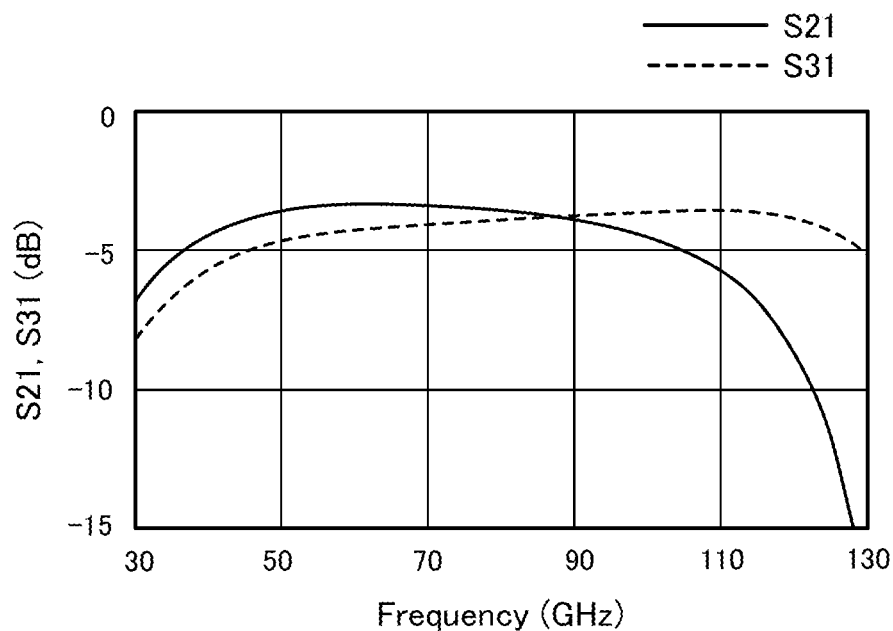
FIGS. 18A and 18B show simulation results of pass characteristics in the working example 6.
Figure 18B:
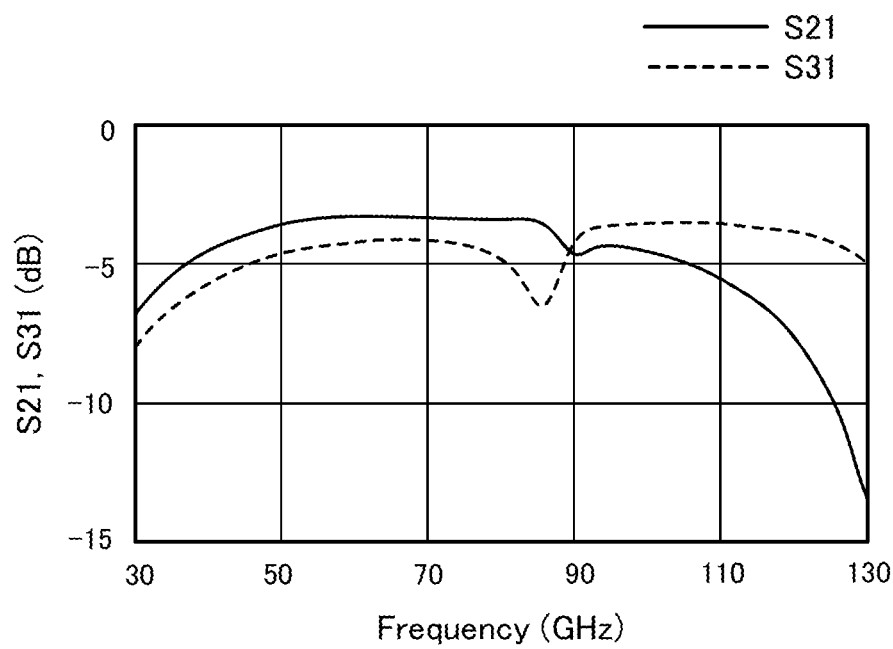

FIG. 18A shows the simulation results of the pass characteristics on the condition that the inclination angles θ1=30° and θ2=0° and no meander lines exist, as shown in FIG. 17A. FIG. 18B shows the simulation results of the pass characteristics on the condition that the inclination angles θ1=30° and θ2=0° and meander lines exist, as shown in FIG. 17B.

As shown in FIG. 18A, in the case where only the first balanced line 14 of the balance-unbalance converter is inclined at the inclination angle of 30° and no meander lines exist, it can be understood that both the pass characteristics S21 and S31 are above −5 dB, for example, in the frequency range from 50 to 90 GHz, and thus the insertion loss is small similarly to the straight-line-structure balance-unbalance converter.

On the other hand, as shown in FIG. 18B, in the case where only the first balanced line 14 of the balance-unbalance converter is inclined at the inclination angle of 30° and meander lines exist, the pass characteristic S31 is greatly depressed at or just before 90 GHz. In other words, in the case of the balance-unbalance converter in which only the balanced line 14 is inclined at the inclination angle of 30°, although the deterioration in the pass characteristics due to the electromagnetic effect from the adjacent electronic circuit 20 to the first balanced line 14 is reduced, the deterioration in the pass characteristics due to the electromagnetic effect from the adjacent electronic circuit 20 to the second balanced line 16 is not reduced, as compared with the straight-line-structure balance-unbalance converter. In view of this, it can be understood that the deterioration in the pass characteristics due to the electromagnetic effect from the adjacent electronic circuit 20 can be selectively reduced.

The balance-unbalance converter in which only one of the first and second balanced lines 14 and 16 is inclined with respect to the boundary line T as in the working example 6 is particularly effective for the case where inductive circuit elements are unevenly distributed in the adjacently-disposed electronic circuit 20.

In view of the above-described comparative example and the working examples 1 to 6, when the operating frequency band is 50 to 90 GHz, the inclination angle θ1 of the first balanced line 14 with respect to the boundary line T and the inclination angle θ2 of the second balanced line 16 with respect to the boundary line T are preferably less than 75°, and more preferably in the range from 15° to 60'.

As described above, the present invention has the advantageous effect that it is possible to reduce the deterioration in electrical characteristics due to the electromagnetic effect from an adjacent electronic circuit, and thus the present invention is useful for balance-unbalance converters and semiconductor integrated circuits using the same.

DESCRIPTION OF REFERENCE NUMERALS AND SIGNS

1: balance-unbalance converter
10: substrate
12: unbalanced line
12a: first end
12b: second end
12c: longitudinal midpoint
12d: first line portion
12e: second line portion
14: first balanced line
14a: third end
14b: fourth end
16: second balanced line
16a: fifth end
16b: sixth end
18: ground layer
20: electronic circuit
22: meander line
100: semiconductor integrated circuit
D1, D2, D3, D4: diode
GND: ground terminal
B: via-hole
T: boundary line

What is claimed is:

1. A balance-unbalance converter for mutually converting a balanced signal and an unbalanced signal, comprising:
a substrate;
an unbalanced line formed on the substrate, the unbalanced line having a first end at which the unbalanced signal is input or output, and having a second end that is open;
a first balanced line disposed on the substrate in parallel with a line portion of the unbalanced line from the first end to a midpoint of the unbalanced line, the first balanced line having a midpoint-side third end at which the balanced signal is output or input, and having a fourth end that is grounded; and
a second balanced line disposed on the substrate in parallel with a line portion of the unbalanced line from the second end to the midpoint of the unbalanced line, the second balanced line having a midpoint-side fifth end at which the balanced signal is output or input, and having a sixth end that is grounded;
wherein the unbalanced line is bent at the midpoint toward an opposite side of the first and second balanced lines,
wherein at least one of the first balanced line and the second balanced line is inclined with respect to a boundary line between the balance-unbalance converter and an electronic circuit that is disposed adjacent to the first and second balanced lines side of the balance-unbalance converter on the substrate, and
wherein an inclination angle (θ1) of the first balanced line with respect to the boundary line and an inclination angle (θ2) of the second balanced line with respect to the boundary line are each less than 75°.

2. The balance-unbalance converter according to claim 1, wherein an inclination angle (θ1) of the first balanced line with respect to the boundary line is equal to an inclination angle (θ2) of the second balanced line with respect to the boundary line.

3. The balance-unbalance converter according to claim 1, wherein an inclination angle ($\theta 1$) of the first balanced line with respect to the boundary line and an inclination angle ($\theta 2$) of the second balanced line with respect to the boundary line are different from each other.

4. The balance-unbalance converter according to claim 1, wherein an inclination angle ($\theta 1$) of the first balanced line with respect to the boundary line and an inclination angle ($\theta 2$) of the second balanced line with respect to the boundary line are each within a range from 15° to 60°.

5. A semiconductor integrated circuit comprising: the balance-unbalance converter according to claim 1; and an electronic circuit that is disposed adjacent to the first and second balanced lines side of the balance-unbalance converter on the substrate made of semiconductor.

6. The semiconductor integrated circuit according to claim 5, wherein the electronic circuit is a frequency converter.

7. The balance-unbalance converter according to claim 2, wherein the inclination angle ($\theta 1$) of the first balanced line with respect to the boundary line and the inclination angle ($\theta 2$) of the second balanced line with respect to the boundary line are each within a range from 15° to 60°.

8. The balance-unbalance converter according to claim 3, wherein the inclination angle ($\theta 1$) of the first balanced line with respect to the boundary line and the inclination angle ($\theta 2$) of the second balanced line with respect to the boundary line are each within a range from 15° to 60°.

9. A semiconductor integrated circuit comprising: the balance-unbalance converter according to claim 2; and an electronic circuit that is disposed adjacent to the first and second balanced lines side on the substrate made of semiconductor.

10. A semiconductor integrated circuit comprising: the balance-unbalance converter according to claim 3; and an electronic circuit that is disposed adjacent to the first and second balanced lines side on the substrate made of semiconductor.

11. A semiconductor integrated circuit comprising: the balance-unbalance converter according to claim 4; and an electronic circuit that is disposed adjacent to the first and second balanced lines side on the substrate made of semiconductor.

12. The semiconductor integrated circuit according to claim 5, wherein the electronic circuit is a frequency converter.

13. The semiconductor integrated circuit according to claim 9, wherein the electronic circuit is a frequency converter.

14. The semiconductor integrated circuit according to claim 10, wherein the electronic circuit is a frequency converter.

15. The semiconductor integrated circuit according to claim 11, wherein the electronic circuit is a frequency converter.

* * * * *